(12) United States Patent
Berendsen et al.

(10) Patent No.: US 9,983,489 B2
(45) Date of Patent: May 29, 2018

(54) METHOD FOR COMPENSATING FOR AN EXPOSURE ERROR, A DEVICE MANUFACTURING METHOD, A SUBSTRATE TABLE, A LITHOGRAPHIC APPARATUS, A CONTROL SYSTEM, A METHOD FOR MEASURING REFLECTIVITY AND A METHOD FOR MEASURING A DOSE OF EUV RADIATION

(71) Applicant: ASML Netherlands B.V., Veldhoven (NL)

(72) Inventors: Christianus Wilhelmus Johannes Berendsen, Roermond (NL); Marcel Beckers, Waalre (NL); Henricus Jozef Castelijns, Bladel (NL); Hubertus Antonius Geraets, Arendonk (NL); Adrianus Hendrik Koevoets, Mierlo (NL); Leon Martin Levasier, Hedel (NL); Peter Schaap, Eindhoven (NL); Bob Streefkerk, Tilburg (NL); Siegfried Alexander Tromp, Papendrecht (NL)

(73) Assignee: ASML Netherlands B.V., Veldhoven (NL)

( * ) Notice: Subject to any disclaimer, the term of this patent is extended or adjusted under 35 U.S.C. 154(b) by 0 days. days.

(21) Appl. No.: 15/311,548

(22) PCT Filed: Apr. 24, 2015

(86) PCT No.: PCT/EP2015/058870
§ 371 (c)(1),
(2) Date: Nov. 16, 2016

(87) PCT Pub. No.: WO2015/185269
PCT Pub. Date: Dec. 10, 2015

(65) Prior Publication Data
US 2017/0115578 A1   Apr. 27, 2017

(30) Foreign Application Priority Data

Jun. 3, 2014 (EP) .................................. 14170954
Mar. 27, 2015 (EP) .................................. 15161238

(51) Int. Cl.
G03F 7/20 (2006.01)

(52) U.S. Cl.
CPC ...... G03F 7/70883 (2013.01); G03F 7/70033 (2013.01); G03F 7/70625 (2013.01);
(Continued)

(58) Field of Classification Search
CPC ............. G03F 7/70875; G03F 7/70891; G03F 7/70783
See application file for complete search history.

(56) References Cited

U.S. PATENT DOCUMENTS 5,834,785 A * 11/1998 Coon .................. G03F 7/70558
250/398
7,830,493 B2   11/2010 Tinnemans et al.
(Continued)

FOREIGN PATENT DOCUMENTS

EP      0612862 A1    8/1994
JP      62197743 A    9/1987
(Continued)

OTHER PUBLICATIONS

Anonymous Research Disclosure, Mason Publications, Questel Ireland Ltd., vol. 587, No. 47, Mar. 2013, ISSN:0374-4353; 9 pages.
(Continued)

*Primary Examiner* — Michelle M Iacoletti
(74) *Attorney, Agent, or Firm* — Sterne, Kessler, Goldstein & Fox P.L.L.C.

(57) ABSTRACT

A method for compensating for an exposure error in an exposure process of a lithographic apparatus that comprises a substrate table, the method comprising: obtaining a dose measurement indicative of a dose of IR radiation that reaches substrate level, wherein the dose measurement can be used to calculate an amount of IR radiation absorbed by an object in the lithographic apparatus during an exposure process; and using the dose measurement to control the exposure process so as to compensate for an exposure error associated with the IR radiation absorbed by the object during the exposure process.

21 Claims, 4 Drawing Sheets

(52) U.S. Cl.
CPC ...... *G03F 7/70783* (2013.01); *G03F 7/70875* (2013.01); *G03F 7/70891* (2013.01); *G03F 7/70941* (2013.01)

(56) References Cited

U.S. PATENT DOCUMENTS

| | | |
|---|---|---|
| 2005/0045829 A1 | 3/2005 | Ito et al. |
| 2005/0136346 A1 | 6/2005 | Ottens et al. |
| 2007/0153244 A1* | 7/2007 | Maria Zaal ......... G03F 7/70341 355/30 |
| 2008/0002753 A1 | 1/2008 | Timans |

FOREIGN PATENT DOCUMENTS

| | | |
|---|---|---|
| JP | H05315222 A | 11/1993 |
| JP | 2002340794 A | 11/2002 |
| WO | WO 2013-056941 A1 | 4/2013 |
| WO | WO 2013-072144 A1 | 5/2013 |
| WO | WO 2013-139553 A2 | 9/2013 |
| WO | WO 2014-095266 A2 | 6/2014 |

OTHER PUBLICATIONS

"Heat flux sensor", Wikipedia, downloaded from: https://en.wikipedia.org/wiki/Heat_flux_sensor; 7 pages.

R.M. Vermaasdonk et al., "Laser light delivery systems for medical applications", Phys. Med. Biol. 42 (1997); pp. 869-894.

S. Artjushenko et al., "Infrared Fibers: Power Delivery and Medical Applications", SPIE vol. 2396 No. 25 (doi: 10.1117/12.208409); 12 pages.

International Preliminary Search Report and Written Opinion of the International Searching Authority directed to International Application. No. PCT/EP2015/058870, dated Dec. 6, 2016; 12 pages.

International Search Report directed to International Application No. PCT/EP2015/058870, dated Oct. 14, 2015; 5 pages.

* cited by examiner

METHOD FOR COMPENSATING FOR AN EXPOSURE ERROR, A DEVICE MANUFACTURING METHOD, A SUBSTRATE TABLE, A LITHOGRAPHIC APPARATUS, A CONTROL SYSTEM, A METHOD FOR MEASURING REFLECTIVITY AND A METHOD FOR MEASURING A DOSE OF EUV RADIATION

CROSS-REFERENCE TO RELATED APPLICATIONS

This application claims the benefit of EP application 14170954.3, which was filed on 3 Jun. 2014, and EP application 15161238.9, which was filed on 27 Mar. 2015, and which are incorporated herein in its entirety by reference.

FIELD

The present invention relates to a method for compensating for an exposure error, a device manufacturing method, a substrate table, a lithographic apparatus, a control system, a method for measuring reflectivity and a method for measuring a dose of EUV radiation.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source. Radiation from the laser can undesirably affect an exposure process in which the substrate is exposed by the pattern.

It is desirable to reduce any undesirable effects of the radiation from the laser.

SUMMARY OF THE INVENTION

According to an aspect of the invention, there is provided a method for compensating for an exposure error in an exposure process of a lithographic apparatus that comprises a substrate table, the method comprising: obtaining a dose measurement indicative of a dose of IR radiation that reaches substrate level, wherein the dose measurement can be used to calculate an amount of IR radiation absorbed by an object in the lithographic apparatus during an exposure process; and using the dose measurement to control the exposure process so as to compensate for an exposure error associated with the IR radiation absorbed by the object during the exposure process.

According to an aspect of the invention, there is provided a substrate table for a lithographic apparatus, wherein the substrate table is configured to support a substrate and comprises an IR sensor configured to obtain a dose measurement indicative of a dose of IR radiation that is incident on the substrate table.

According to an aspect of the invention, there is provided a control system for a lithographic apparatus that comprises a substrate table, the control system comprising: a dose measurement module configured to obtain a dose measurement indicative of a dose of IR radiation that is reaches substrate level, wherein the dose measurement can be used to calculate an amount of IR radiation absorbed by an object in the lithographic apparatus during an exposure process; and a compensation module configured to use the dose measurement to control the exposure process so as to compensate for an exposure error associated with the IR radiation absorbed by the object during the exposure process.

According to an aspect of the invention, there is provided a method for compensating for an exposure error in an exposure process of a lithographic apparatus that comprises a substrate table and a conditioning system configured to control the temperature of the substrate table by means of a conditioning fluid, the method comprising: obtaining a temperature change measurement indicative of a temperature change of the conditioning fluid, wherein the temperature change measurement can be used to calculate a heat load at a substrate that is exposed during an exposure process; and using the temperature change measurement to control the exposure process so as to compensate for an exposure error associated with the heat load at the substrate during the exposure process.

According to an aspect of the invention, there is provided a control system for a lithographic apparatus that comprises a substrate table and a conditioning system configured to control the temperature of the substrate table by means of a conditioning fluid, the control system comprising: a temperature change measurement module configured to obtain a temperature change measurement indicative of a temperature change of the conditioning fluid, wherein the temperature change measurement can be used to calculate a heat load at a substrate that is exposed during an exposure process; and a compensation module configured to use the temperature change measurement to control the exposure process so as to compensate for an exposure error associated with the heat load at the substrate during the exposure process.

According to an aspect of the invention, there is provided a method for measuring reflectivity of an exposure substrate for a lithographic apparatus that comprises an illumination system configured to emit a radiation beam, a substrate table and a conditioning system configured to control the temperature of the substrate table by means of a conditioning fluid, the method comprising: obtaining a first temperature change measurement indicative of a temperature change of the conditioning fluid when the substrate table is supporting a tool substrate having a known reflectivity for IR radiation of the radiation beam; obtaining a second temperature change measurement indicative of a temperature change of the conditioning fluid when the substrate table is supporting an exposure substrate; and calculating the reflectivity of the exposure substrate for IR radiation of the radiation beam from the first temperature change measurement, the second temperature change measurement and the known reflectivity.

According to an aspect of the invention, there is provided a method for measuring a dose of EUV radiation for a lithographic apparatus that comprises an illumination system configured to emit a radiation beam, a substrate table and a conditioning system configured to control the temperature of the substrate table by means of a conditioning fluid, the method comprising: obtaining a first temperature change measurement indicative of a temperature change of the conditioning fluid when the lithographic apparatus comprises a first reference patterning device configured to allow a first reference percentage of EUV radiation of the radiation beam to reach the substrate; obtaining a second temperature change measurement indicative of a temperature change of the conditioning fluid when the lithographic apparatus comprises a second reference patterning device configured to allow a second reference percentage of the EUV radiation of the radiation beam to reach the substrate; and calculating a dose of EUV radiation per percentage of EUV radiation of the radiation beam that is allowed to reach the substrate from the first temperature change measurement, the second temperature change measurement, the first reference percentage and the second reference percentage.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
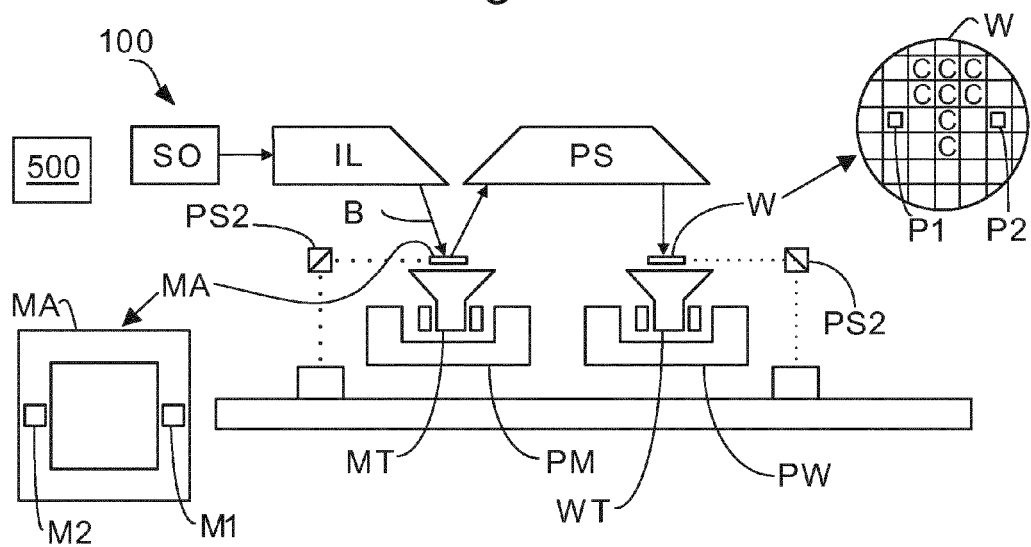
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

FIG. 1 schematically depicts a lithographic apparatus 100 including a source collector module SO according to one embodiment of the invention. The apparatus comprises:

an illumination system (illuminator) IL configured to condition a radiation beam B (e.g., EUV radiation).

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab. In an embodiment the controller 500 operates the apparatus to perform an embodiment of the present invention. In an embodiment the controller 500 embodies a control system according to the present invention.

Combinations and/or variations on the above described modes of use or entirely different modes of use may also be employed.

Figure 2:
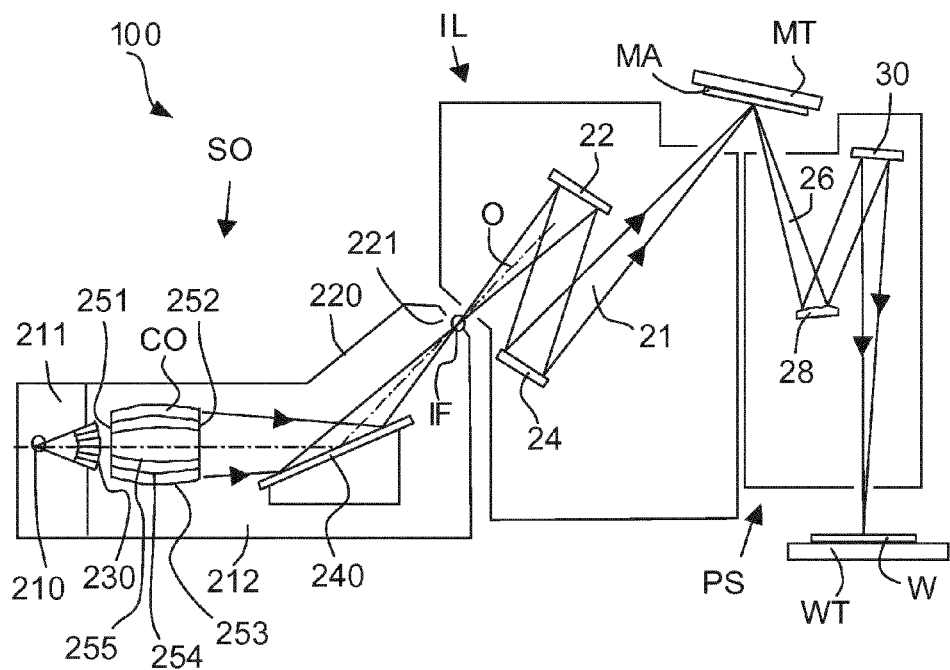
FIG. 2 is a more detailed view of the lithographic apparatus.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) that is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO, which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
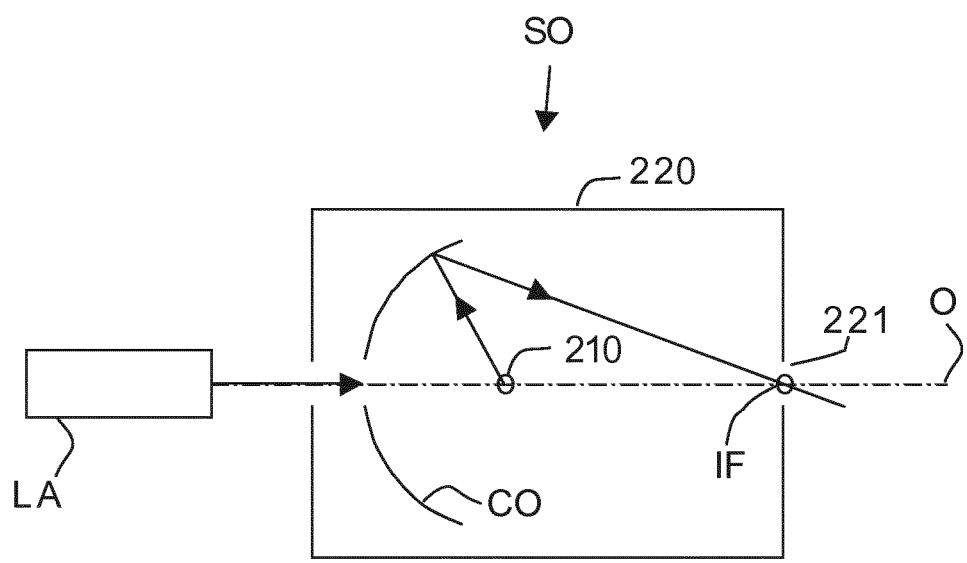
FIG. 3 is a more detailed view of the source collector module of the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Radiation from the laser used in the EUV source can reach several parts of the lithographic apparatus 100. For example, the radiation may reach the substrate W or the substrate table WT via the projection system PS. In an embodiment the laser used in the EUV source is a $CO_2$ laser. In an embodiment the laser produces infrared, IR, radiation. The radiation from the laser can undesirably affect performance of the lithographic apparatus 100. For example, the radiation from the laser can undesirably raise a temperature of one or more components of the lithographic apparatus 100. If the temperature of a component is raised, then this may lead to undesirable deformation of the component. Any deformation of a component of the lithographic apparatus 100 can undesirably affect overlay and focus. The projection system PS may also be adversely affected by IR radiation incident upon it. For example, a mirror of the projection system PS may be deformed because of IR radiation that the mirror absorbs.

In an embodiment a method is provided for compensating for an exposure error in an exposure process of a lithographic apparatus 100. The lithographic apparatus 100 comprises a substrate table WT.

In an embodiment the method comprises obtaining a dose measurement indicative of a dose of IR radiation that reaches substrate level. For example the dose measurement may be indicative of a dose of IR radiation that is incident on the substrate table WT. The dose measurement is indicative of the amount of IR radiation that reaches the substrate level during an exposure process.

In an embodiment the dose measurement can be used to calculate an amount of IR radiation absorbed by an object in the lithographic apparatus 100 during an exposure process. In an embodiment the object is the substrate W that is exposed during the exposure process. The dose measurement can be used to calculate the amount of IR radiation that would be absorbed by the substrate W during the exposure process. For example, an amount of IR radiation absorbed by the substrate W may be calculated from the dose measurement if the absorptivity (i.e. absorbance) of the substrate W is known for the IR radiation. The absorptivity is the fraction of incident IR radiation that is absorbed by the substrate W. For example, an absorptivity of 0.4 implies that 40% of incident IR radiation is absorbed, with the remaining 60% of the radiation being either reflected or transmitted.

It is not necessary for the amount of IR radiation absorbed by the object to be actually calculated. It may be sufficient for the dose measurement to be obtained and used for feed-forward processing.

In an embodiment the object is the substrate table WT. In this case the dose measurement can be used to calculate the amount of IR radiation absorbed by the substrate table WT during the exposure process. This may be done if the absorptivity of the substrate table WT is known.

Figure 5:
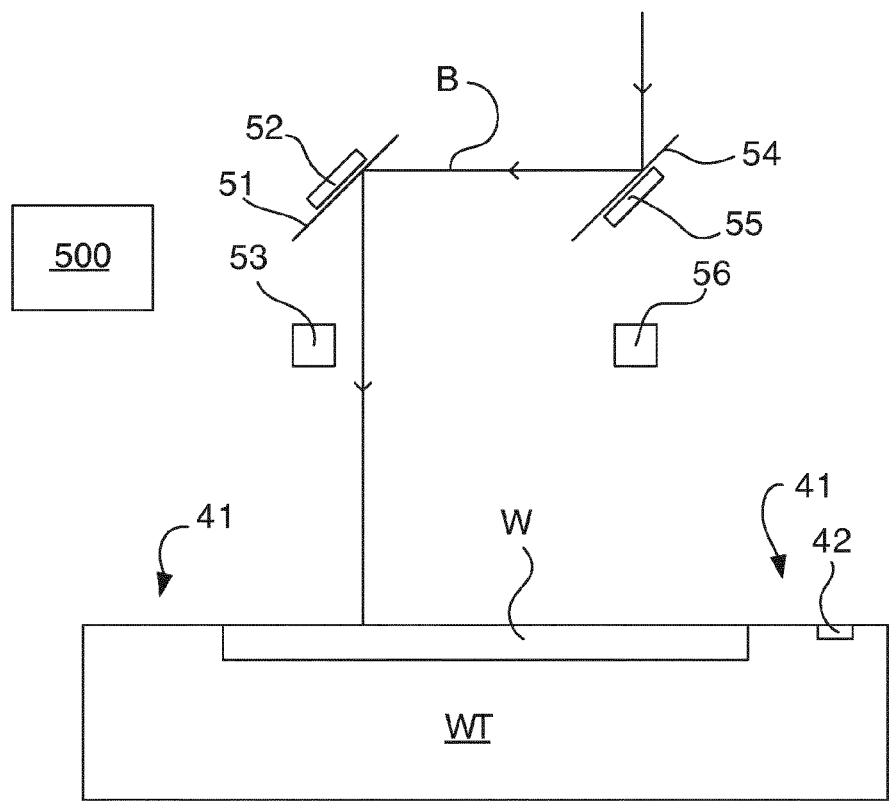
FIG. 5 depicts schematically part of a lithographic apparatus according to an embodiment of the present invention.

In an embodiment the object is a mirror 51, 54 or a reflective element 28, 30 of the projection system PS that projects the pattern beam of radiation for the exposure process onto the substrate W. FIG. 5 depicts schematically part of the lithographic apparatus 100, including part of the projection system PS. FIG. 5 depicts mirros 51, 54 of the projection system PS. FIG. 2 depicts reflective elements 28, 30 of the projection system PS. The absorbed IR radiation is relevant for all mirrors or reflective elements of the projection system PS. In an embodiment the projection system comprises more than two mirrors. For example there may be about eight mirrors in the projection system PS. The dose measurement can be used to calculate the amount of IR radiation absorbed by the mirror 51, 54 during the exposure process. This may be done if the absorptivity of the components of the projection system PS between the source of IR radiation, e.g. the laser, and the substrate table WT is known.

In an embodiment the projection system PS comprises a series of mirrors 51, 54. For example, the projection system PS may comprise about six mirrors 51, 54. With the dose measurement at substrate level, the amount of IR radiation absorbed by the mirrors 51, 54 of the projection system PS can be calculated with the absorptivity value (or reflectivity value) per mirror 51, 54.

In an embodiment the method comprises using the dose measurement to control the exposure process so as to compensate for an exposure error associated with the IR radiation absorbed by the object during the exposure process. For example, if the object is the substrate W, then absorption of the IR radiation by the substrate W can lead to heating of the substrate W. In turn, heating of the substrate W can lead to deformation of the substrate W. Such a deformation of the substrate W can lead to decrease in performance of the lithographic apparatus 100 e.g. by affecting overlay and focus. The dose measurement can be used to control the exposure process so as to compensate for the overlay error associated with the IR radiation absorbed by the substrate W during the exposure process.

In an embodiment the step of controlling the exposure process comprises controlling the position of the substrate table WT relative to the patterned beam of radiation based on the dose measurement. In an embodiment the dose measurement is used by the controller 500 to control the second positioner PW that is configured to accurately position the substrate table WT. The dose measurement may be used to adjust positioning of the substrate W during the exposure process so as to reduce the effect of IR radiation absorption at the substrate W on the overlay and focus. This is an example of feed-forward compensation.

If the object is the substrate table WT, then deformation of the substrate table WT due to IR radiation absorption can undesirably affect overlay and focus. Based on the dose measurement, positioning of the substrate table WT may be controlled for the exposure process so as to compensate for the overlay error and focus error associated with the IR radiation absorption at the substrate table WT.

In an embodiment the step of controlling the exposure process comprises controlling focus of the projection system PS so as to compensate for the exposure error associated with the IR radiation absorption.

In an embodiment the object is a mirror 51, 54 or a reflective element 28, 30 of the projection system PS. When the mirror 51, 54 absorbs the IR radiation, the mirror 51, 54 is heated. Heating of the mirror 51, 54 can lead to deformation of the mirror 51, 54. In an embodiment the mirror 51, 54 may be formed from a material that minimises deformation of the mirror 51, 54 due to heat. For example, the mirror 51, 54 may be formed from a low expansion glass. Nevertheless, any deviation away from the target temperature of the mirror 51, 54 can result in an undesirable deformation of the mirror 51, 54. Such a deformation can undesirably reduce performance of the lithographic apparatus 100.

As depicted in FIG. 5, in an embodiment the lithographic apparatus 100 comprises a heater 52, 55 configured to heat the mirror 51, 54. In an embodiment, each mirror 51, 54 is provided with an associated heater 52, 55. However, this need not necessarily be the case. In an embodiment a single heater may be used to heat a plurality of mirrors 51, 54. In an embodiment each mirror 51, 54 has at least one associated heater 52, 55. Some mirrors 51, 54 may have more than one associated heater 52, 55. In an embodiment the heater 52, 55 is spaced from the mirror 51, 54. However, this need not necessarily be the case. In an embodiment the heater 52, 55 is a contact heater that is in contact with the associated mirror 51, 54.

In an embodiment the controller 500 is configured to implement a mirror preheating system. The controller 500 may be configured to control the heater 52, 55 so as to heat the mirror 51, 54 to a target temperature. In an embodiment the lithographic apparatus 100 comprises a temperature sensor 53, 56 configured to sense the temperature of the mirror 51, 54. As depicted in FIG. 5, in an embodiment each mirror 51, 54 is provided with a corresponding temperature sensor 53, 56.

In an embodiment the temperature sensor 53, 56 sends a signal indicative of the temperature of the mirror 51, 54 to the controller 500. The controller 500 controls the heater 52, 55 based on the signal indicative of the temperature of the mirror 51, 54 so as to control the mirror 51, 54 to maintain the target temperature.

In an embodiment the temperature sensor 53, 56 is distal from the mirror 51, 54. For example, in an embodiment the temperature sensor 53, 56 may be spaced about 10 mm away from the optical surface of the mirror 51, 54. The temperature sensor 53, 56 may be spaced away from the mirror 51, 54 so as to minimise surface deformation. However, it is not necessary for the temperature sensor 53, 56 to be distal from the mirror 51, 54. In an embodiment the temperature sensor 53, 56 is in contact with the mirror 51, 54. For example the temperature sensor 53, 56 may be glued to the mirror 51, 54 in such a way that substantially no mechanical distortion to the mirror 51, 54 is caused by the temperature sensor 53, 56.

As a result of the space between the temperature sensor 53, 56 and the mirror 51, 54, there may be a time delay in the closed control loop using for controlling the temperature of the mirror 51, 54. The temperature sensor 53, 56 may respond late to any changing load such as an EUV load or an IR radiation load to the mirror 51, 54. The time delay can result in a temperature error at the mirror 51, 54. The temperature error, i.e. deviation away from a target temperature, can result in loss of optical performance by the lithographic apparatus 100.

According to the invention, the dose measurement is related to the amount of IR radiation absorbed by the mirror 51, 54 during the exposure process. By feeding forward the dose measurement into the controller 500, the undesirable effect of the temperature error at the mirror 51, 54 on the optical performance of the lithographic apparatus 100 can be reduced.

The dose measurement cannot be performed real time during exposure. This is because during exposure, the radiation beam is focused on the substrate W and not on any IR sensor 42 that can perform the dose measurement. In an embodiment the dose measurement is used as a calibration value related to the ratio of IR radiation to EUV radiation in the radiation beam. The amount of EUV radiation in the radiation beam (i.e. the EUV radiation dose) during exposure may be calculated. In an embodiment the controller 500 is configured to calculate the amount of IR radiation in the radiation beam during exposure from the calculated EUV radiation dose and the measured calibration value.

In addition to feeding forward the IR radiation information, the EUV radiation may also be taken into account in the feed-forward model. In an embodiment the lithographic apparatus 100 comprises a spot sensor configured to measure a dose of EUV radiation at the substrate level. With the measured EUV radiation at substrate level and absorptivity values for EUV radiation per mirror 51, 54, it is possible to calculate back the EUV radiation absorbed per mirror 51, 54. Hence, the measurement obtained by the spot sensor can be used to compensate for the effects of the EUV radiation absorbed by the mirror 51, 54 on the optical performance of the lithographic apparatus 100.

Figure 4:
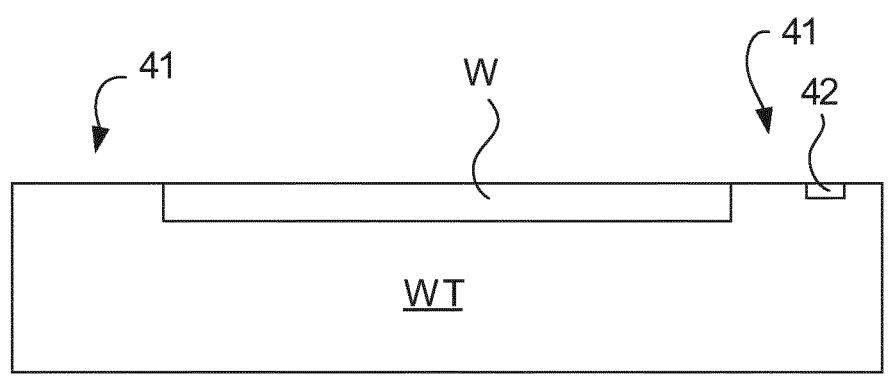
FIG. 4 depicts schematically a substrate table according to an embodiment of the present invention.

FIG. 4 depicts a substrate table WT according to an embodiment of the invention. As depicted in FIG. 4, in an embodiment the substrate table WT is configured to support the substrate W. In an embodiment the substrate table WT comprises an IR sensor 42. The IR sensor 42 is configured to obtain the dose measurement indicative of the dose of IR radiation that is incident on the substrate table WT. In an embodiment the IR sensor 42 is fibre-coupled. An advantage of fibre-coupling the IR sensor 42 is that it would save space on the substrate table WT around the substrate W.

In an embodiment the step of obtaining the dose measurement is performed by the IR sensor 42. In an embodiment the IR sensor 42 is positioned at a peripheral part 41 of the substrate table WT. The peripheral part 41 of the substrate table WT is at a top surface of the substrate table WT. The peripheral part 41 of the substrate table WT is a part that does not support the substrate W. During a process of exposing successive substrates W, the IR sensor 42 is not covered by a substrate that is being exposed. When the radiation beam is directed towards the IR sensor 42, the dose measurement can be obtained. However, during exposure the radiation beam is directed towards the substrate W such that the dose measurement cannot be obtained.

IR radiation is radiation that has a wavelength longer than those of visible light. IR radiation has a wavelength in the range of from about 0.7 µm to about 1000 µm. In an embodiment the dose measurement is indicative of a dose of IR radiation having a wavelength in the range of from about 10.5 µm to about 10.6 µm. In an embodiment the IR radiation has a wavelength of about 10.5 µm. In an embodiment the IR radiation has a wavelength of about 10.6 µm. In an embodiment the IR sensor 42 is configured to obtain dose measurement indicative of the dose of IR radiation having the wavelength in the range of from about 10.5 µm to about 10.6 µm. However, it is not necessary for the wavelength to be in the range of from about 10.5 µm to about 10.6 µm. The invention is applicable to a broader range of wavelengths. For example, in an embodiment the relevant wavelength is in the range of from about 1 µm to about 10.6 µm, or in the range of from about 1 µm to about 2 µm.

In an embodiment the IR sensor 42 is positioned close to an area where the EUV dose is measured, e.g. close to the spot sensor. The EUV dose may be measured by a spot sensor (not shown). In an embodiment the IR sensor 42 is configured to send to the controller 500 a signal indicative of the dose measurement. The controller 500 may use the dose measurement to control the exposure process in a feed-forward process.

In an embodiment the IR sensor 42 comprises a cover that is substantially transparent to IR radiation having a wavelength in the range of from about 10.5 µm to about 10.6 µm, and substantially opaque to radiation having lower wavelengths such as EUV radiation.

The type of IR sensor 42 used is not particularly limited. In an embodiment the IR sensor 42 is selected from a group consisting of a thermopile sensor, a pyro-electric sensor and a photovoltaic detector. An advantage of a pyro-electric sensor and a photovoltaic detector relative to a thermopile sensor is that they have a relatively quick response time. In an embodiment the IR sensor 42 comprises a pulse energy measurement detector similar to a pulse energy measurement detector used in the EUV source.

In an embodiment the IR sensor 42 comprises a spectrometric detector. Such a spectrometric detector is advantageous particularly if IR radiation wavelengths other than 10.5 µm to 10.6 µm are expected to be dominant in the exposure processes performed by the lithographic apparatus 100. However, such a spectrometric detector is typically larger than other types of IR sensor. Accordingly, in an embodiment a mirror or waveguide system is provided to lead IR radiation from the substrate level to the spectrometric detector placed outside of the substrate table area.

In an embodiment, the dose measurement is obtained at the substrate table WT. However, it is not necessary for the dose measurement to be obtained at the substrate table WT. In an embodiment the dose measurement is obtained at a location elsewhere in the optical system. For example, an IR sensor may be disposed at a position optically upstream of the substrate table WT.

In an embodiment the controller 500 is configured to determine the dose of IR radiation that reaches the substrate level from the measurement obtained by the IR sensor optically upstream of the substrate table WT. For example the controller 500 may extrapolate from the upstream measurement to determine the dose of IR radiation that reaches the substrate level.

In an embodiment the substrate table WT comprises a thermal conditioning system. The thermal conditioning system may comprise one or more channels within the substrate table WT. Conditioning fluid, e.g. water, flows through the one or more channels. The temperature of the conditioning fluid is controlled so as to control the temperature of the substrate table WT and/or the substrate W. In an embodiment the thermal conditioning system is positioned below the substrate W.

In an embodiment the dose measurement is obtained via measuring a temperature of the conditioning fluid used to thermally condition the substrate table WT. The temperature of the conditioning fluid at a downstream end of the one or more channels is indicative of the total (i.e. EUV and IR)

radiation absorbed. The amount of IR radiation absorbed may be calculated if the amount of EUV radiation absorbed is known. Alternatively, the amount of IR radiation absorbed may be calculated if the proportion of IR radiation to EUV radiation at the substrate level is known. In an embodiment, different reticles may be used to determine the ratio between EUV radiation and IR radiation at the substrate level.

In order to calculate overlay and focus errors due to IR heating, it is helpful to separate the absorption of radiation by the substrate W from the absorption of radiation by the substrate table WT. The absorption characteristics of the substrate W including any layers on the substrate W can vary. However, if the percentage of the radiation that is reflected, absorbed and transmitted by the substrate W is known, then the temperature of the conditioning fluid can be used as an indicator of the dose of IR radiation that reaches the substrate level. The temperature of the conditioning fluid is a relatively low frequency indicator of dose.

The invention may be embodied as a control system for a lithographic apparatus 100. In an embodiment the control system comprises a dose measurement module configured to obtain a dose measurement indicative of a dose of IR radiation that is incident on the substrate table WT, wherein the dose measurement can be used to calculate an amount of IR radiation absorbed by an object in the lithographic apparatus 100 during an exposure process.

In an embodiment the control system comprises a compensation module configured to use the dose measurement to control the exposure process so as to compensate for an exposure error associated with the IR radiation absorbed by the object during the exposure process.

In an embodiment the lithographic apparatus 100 comprises a conditioning system configured to control the temperature of the substrate table WT by means of a conditioning fluid. The present invention allows for the overlay fingerprint due to IR radiation heating contributions to be reduced significantly.

The absorptivity of an object for IR radiation is dependent on the material of the object. For example, the absorptivity of the substrate W for the IR radiation is dependent on the material of the substrate W, any doping level of the substrate W and any layer or layers on the substrate W. These factors can affect the amount of IR radiation that is absorbed, transmitted or reflected at the substrate W. The absorptivity of the substrate W can depend on the exact IC design.

In an embodiment the method comprises obtaining an absorptivity measurement indicative of an absorptivity for the IR radiation of the object. For example, the absorption by the substrate W may be measured. In an embodiment the measurement of the absorptibity of the substrate W for IR radiation is carried out before the lithography step, i.e. before a batch of substrates W is exposed by the lithographic apparatus 100. In an embodiment the absorptivity measurement of the object is performed at substantially the same wavelength as the wavelength of radiation emitted by the laser of the source.

For example, in an embodiment the absorptivity measurement is performed by a measurement apparatus 60 other than the lithographic apparatus 100 that performs the exposure process. In an embodiment the step of obtaining the absorptivity measurement is performed by a substrate handler. An EUV exposure process is typically performed substantially at vacuum pressure. However, the measurement of the absorptivity of the substrate W, or other object, does not need to be performed in vacuum.

Figure 6:
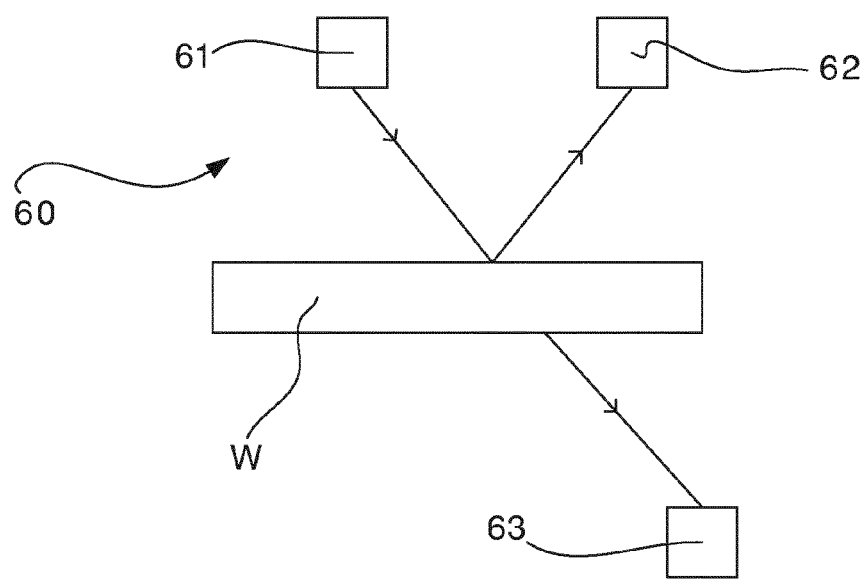
FIG. 6 depicts schematically a measurement apparatus.

FIG. 6 depicts a measurement apparatus 60 configured to perform the step of obtaining the absorptivity measurement.

In an embodiment the measurement apparatus 60 comprises an IR radiation source 61. The type of IR radiation source 61 is not particularly limited. In an embodiment the IR radiation source 61 is a $CO_2$ laser. In an embodiment the intensity of IR radiation output by the IR radiation source 61 is known, and relatively low. For example, the intensity of radiation output by the IR radiation source 61 may be less than the intensity of IR radiation output by the laser used for the EUV radiation source. The power of the IR radiation source 61 should be high enough to enable reliable signal on the detectors, but as low as possible to avoid heating or damage of the substrate W.

In an embodiment the measurement apparatus 60 comprises at least one IR radiation detector 62. The IR radiation detector 62 is configured to measure a reflected portion of the IR radiation incident on the object, e.g. the substrate W. In an embodiment the IR radiation detector 62 is positioned so as to measure the reflected portion of specularly reflected IR radiation. In an embodiment, one or more additional IR radiation detectors (not shown) may be provided so as to measure the reflected portion of diffusely reflected IR radiation.

The type of the IR radiation detector 62 is not particularly limited. In an embodiment the IR radiation detector 62 is selected from a group consisting of a thermopile sensor, a pyro-electric sensor and a photovoltaic detector.

In an embodiment the measurement apparatus 60 comprises a transmission sensor 63. The transmission sensor 63 is positioned on an opposite side of the object, e.g. the substrate W, from the IR radiation source 61. The transmission sensor 63 is configured to measure the transmitted portion of IR radiation incident on the substrate W from the IR radiation source 61. From the measurement of the transmitted portion and the reflected portion, the remaining portion of light corresponds to the absorbed portion indicating the absorptivity of the substrate W.

In an embodiment, the transmitted portion and the reflected portion are measured simultaneously. However, this does not necessarily need to be the case. In an embodiment, the transmitted portion and the reflected portion may be measured sequentially. An advantage of measuring the transmitted portion and the reflected portion sequentially is that it allows for the use of only a single sensor. However this would require movement of the sensor, the substrate W, mirrors, and/or the incident angle of the IR radiation from the IR radiation source 61. The effect on the measured transmitted portion or reflected portion could be compensated for.

In an embodiment the measurement apparatus 60 is not provided with the transmission sensor 63. It may be that the transmitted portion is always low relative to the reflected portion and the absorbed portion. In this case, a measurement of the reflected portion would be sufficient to determine the absorptivity of the substrate W. A low transmitted portion may be expected for doped substrates W, for example.

The dominant IR wavelength in the lithographic apparatus 100 reaching the substrate W has been found to be within the range of from about 10.5 µm to about 10.6 µm. The optical properties of the substrate W are wavelength-dependent. Accordingly, it is desirable that the IR radiation source 61 of the measurement apparatus 60 outputs IR radiation having a similar or same wavelength as that of the IR radiation output by the laser used for the EUV radiation source.

In an embodiment the IR radiation source 61 outputs IR radiation directly towards the substrate W. However, in an embodiment optics may be positioned between the IR radiation source 61 and the substrate W when measuring the absorptivity. For example, mirrors, lenses and/or optical fibres may form part of such optics. Mirrors for the optics may be formed from a material selected from the group consisting of silver, gold and diamond. Any lens in the optical system may be selected from a group consisting of germanium, zinc selenide, sodium chloride and potassium chloride. In an embodiment any optical fibre of the optical system may comprise a hollow-core glass fibre, a hollow-core ceramic fibre, and an AgCl:AgBr optical fibre.

In an embodiment the IR radiation source 61 comprises a broadband IR radiation source. In this case, the measurement apparatus 60 may comprise a bandpass filter. Such a bandpass filter may be formed from zinc selenide and may optionally comprise an anti-reflective coating.

In an embodiment the IR radiation detector 62 and/or the transmission sensor 63 are specified for use at the IR radiation used, for example 10.6 µm. In an embodiment the IR radiation detector 62 and/or the transmission sensor 63 are fibre-coupled. An advantage of fibre-coupling the sensors is that it would save space around the substrate W.

In case multiple IR wavelengths are important, a broader-range IR radiation source and spectrometric detectors may be used. Other wavelengths may be caused by radiation of heated machine parts, but may be of lower power than the laser light from the laser used in the EUV radiation source.

For the absorptivity measurement, the angle of incidence, reflection and transmission should be chosen such that the IR radiation source 61, the IR radiation detector 62 and the transmission sensor 63 can be positioned as closely as possible to the substrate W. Orthogonal placement is possible if a reflection probe is provided, suitable for the IR radiation having the specific wavelength used. Such a reflection probe may combine the IR radiation source 61 and the IR radiation detector 62 in a single probe.

The absorptivity of the substrate W depends on the structure of any layer or layers on the substrate W. The absorptivity of the substrate W may be position-dependent. In an embodiment the absorptivity measurement is position-dependent. For example, the absorptivity of the substrate W may be measured for a series of different locations on the substrate W, e.g. for a series of locations within one or more dies on the substrate W. Once the dose measurement at the substrate level during the exposure process is measured, the position-dependent absorptivity measurement can be used to determine a position-dependent level of IR radiation absorbed by the substrate W. This position-dependent information can be used in the feed-forward model of the present invention.

For example, the absorptivity of the substrate W may be measured for each die on the substrate W. In order to obtain the position-dependent absorptivity measurement, a substrate scanning or rotation movement may be implemented in the measurement apparatus 60.

In order to gain a more complete understanding of the heat generated by the IR radiation, the optical properties of the substrate table WT may be measured. For example, as mentioned above the object may be the substrate table WT. In this case the absorptivity of the substrate table WT may be measured. The absorptivity of the substrate table WT (and any mirrors 51, 54 or reflective elements 28, 30 of the projection system PS) may be measured once during the development process of the lithographic apparatus 100. It may not be necessary for the lithographic apparatus 100 or the measurement apparatus 60 to measure the absorptivity of the substrate table WT, for example.

In an embodiment, resulting deformations of the object, e.g. the substrate W, and/or the overlay error and/or the focus error may be calculated from the dose measurement. In an embodiment the method comprises calculating an effect of the IR radiation absorbed by the object on one or more of a deformation of the object, an overlay error of the exposure process, a temperature of the object and a focus error (i.e. focus of the projection system PS onto the substrate W). Calculation of the effect can help to determine how the lithographic apparatus 100 is to be controlled to compensate for the effect in the feed-forward control. However, it is not necessary to calculate the effect that the thermal load would have if it were not compensated for. For example, it may already be known what feed-forward control is required to compensate for the effect that would be caused by a measured dose of IR radiation. In this case, the dose measurement value may be input to the controller 500, which controls the feed-forward model based on the dose measurement without calculating the effect that the IR radiation would have had.

The invention may be embodied in a device manufacturing method using a lithographic apparatus 100, wherein an exposure error associated with IR radiation absorbed by the object in the exposure process is compensated for using the method of the invention.

The dose measurement is obtained by the lithographic apparatus 100 that performs the exposure process. This provides an accurate measurement of the level of IR radiation absorbed by the mirrors 51, 54, the substrate W and the substrate table WT during the exposure process. For example, it may be assumed that the level of IR radiation at the substrate position is approximately the same as the level of IR radiation at the substrate table WT. Hence, by obtaining the dose measurement at the substrate table WT, the level of IR radiation at the substrate W during an exposure process may be calculated. As another example, it may be assumed that the level of IR radiation does not substantially vary between a time of obtaining the dose measurement and a time of performing an exposure process. Hence, by obtaining the dose measurement, the level of IR radiation at subsequent times may be calculated. More frequent dose measurements improves the accuracy of the calculation of the level of IR radiation. This allows for an accurate feed-forward model reducing the overlay error and/or focus error and increasing the performance of the lithographic apparatus 100.

The IR radiation that reaches the substrate level may vary during use of the lithographic apparatus 100. This may be due to drifting of the alignment of the laser used in the EUV radiation source overtime. For example, any drifting of the alignment of the laser over time can result in a varying passing of radiation reflected from the particles of tin, for example. This can result if differing amounts of IR radiation reaching the substrate level.

In an embodiment the dose measurement is repeated during use of the lithographic apparatus 100. For example, the dose measurement may be performed between the exposure processes of successive substrates W. However, it is not necessary for the dose measurement to be performed separately for each substrate W in this way. In an embodiment the dose measurement may be performed once for a batch of substrates W.

An advantage of frequently performing the dose measurement is that it allows for variations in the IR radiation level at the substrate level to be accounted for in the feed-forward model. In an embodiment the dose measurement is repeated between exposure of successive dies of a single substrate W.

This has the advantage of more accurately accounting for any variation of IR radiation at the substrate level over time. Desirably, a balance is reached between accounting for the variation of IR radiation at the substrate level over time and maintaining a high throughput by reducing time spent between exposure processes.

Figure 8:
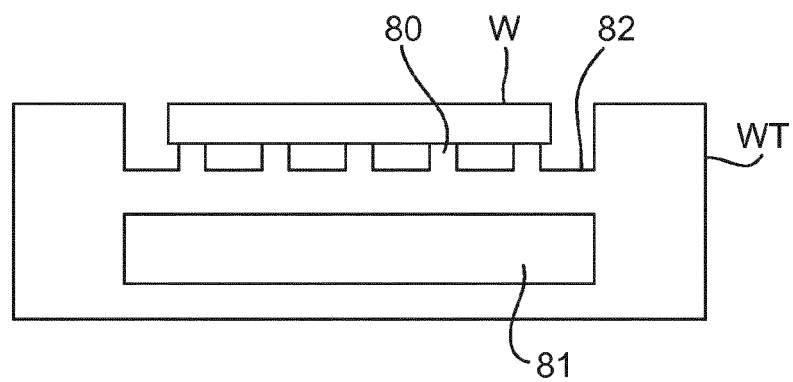
FIG. 8 depicts schematically a substrate on a substrate table according to an embodiment of the present invention.

As depicted in FIG. 8, in an embodiment the lithographic apparatus 100 comprises a conditioning system 81. The conditioning system 81 is configured to control the temperature of the substrate table WT by means of a conditioning fluid. In an embodiment the conditioning system 81 is configured to supply heat to and/or remove heat from the substrate table WT. The substrate table WT can condition the substrate W during exposures so as to reduce deformation of the substrate W due to a thermal load on the substrate W. The conditioning system 81 can condition the substrate table WT. In an embodiment the conditioning system 81 is configured to supply heat to and/or remove heat from the rest of the substrate table WT. Conditioning the substrate table WT can reduce deformation of the substrate table WT. The reduction in deformation of the substrate table WT can result in a reduction in the deformation substrate W.

Figure 9:
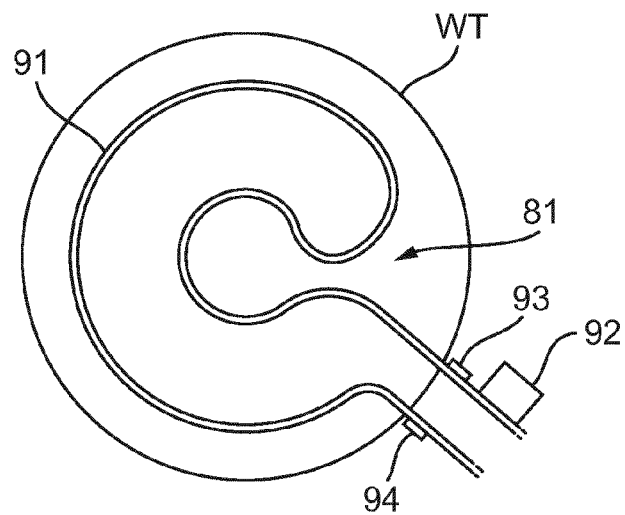
FIG. 9 depicts schematically in plan view a substrate table according to an embodiment of the present invention.

FIG. 9 illustrates an arrangement of the conditioning system 81. FIG. 9 is a plan view of the substrate support area of the substrate table WT. As depicted in FIG. 9, in an embodiment the conditioning system 81 comprises a channel 91. The channel 91 is within the substrate table WT. A conditioning fluid (e.g. water) is provided to flow through the channel 91. The channel 91 is configured to follow a path under the position of the substrate W. The path of the channel 91 is arranged such that an even heating or even cooling can be applied by passing the conditioning fluid through the channel 91.

In an embodiment the conditioning system 81 comprises the first temperature sensor 93. The temperature of the conditioning fluid entering the channel 91 can be detected by a first temperature sensor 93. In an embodiment the conditioning system 81 comprises a second temperature sensor 94. The temperature of conditioning fluid exiting the channel 91 can be detected by the second temperature sensor 94. The positions of the first temperature sensor 93 and the second temperature sensor 94 are not particularly limited. The second temperature sensor 94 is downstream of the first temperature sensor 93.

In an embodiment the conditioning system 81 comprises further temperature sensors. Further temperature sensors are optional. For example, further temperature sensors may be provided in the channel 91 to detect the temperature at local points in the channel 91. A controller can be provided with data from the first temperature sensor 93 and the second temperature sensor 94 and any further temperature sensors in the channel 91.

In an embodiment, the conditioning system 81 comprises a heater 92. The heater 92 is configured to provide heat to the substrate table WT. The controller can control the temperature of the conditioning fluid using the heater 92. The heater 92 of the conditioning system 81 is configured to heat the conditioning fluid prior to the conditioning fluid entering the channel 91.

In an embodiment the step of obtaining the dose measurement is performed by obtaining a temperature change measurement indicative of a temperature change of the conditioning fluid. For example, in an embodiment the step of obtaining the temperature change measurement comprises measuring the temperature of the conditioning fluid before the conditioning fluid enters the channel 91 and measuring the temperature of the conditioning fluid after the conditioning fluid has left the channel 91. In an embodiment the first temperature sensor 93 is used to measure the temperature of the conditioning fluid before the conditioning fluid enters the channel 91. The second temperature sensor 94 can be used to measure the temperature of the conditioning fluid after the conditioning fluid has left the channel 91. A difference between the temperature measured by the first temperature sensor 93 and the second temperature sensor 94 is indicative of the temperature change of the conditioning fluid.

The temperature change of the conditioning fluid depends on a heat load absorbed by the substrate W and a heat load transmitted through the substrate W. Radiation that is absorbed by the substrate W can be radiated and conducted to the conditioning fluid of the conditioning system 81.

For example, FIG. 8 depicts an arrangement in which the substrate table WT comprises a plurality of burls 80. This creates a gap between the bottom surface of the substrate W and the base surface 82 of the substrate table WT. Radiation absorbed by the substrate W can reach the conditioning fluid in the conditioning system 81 by radiation across the gap. A heat load can also be conducted through the burls 80 towards the conditioning system 81.

Radiation that is transmitted through the substrate W can be absorbed by the substrate table WT from where the thermal load can be passed on to the conditioning fluid. Accordingly, the temperature change of the conditioning fluid can be used as a measure of the radiation that is absorbed by the substrate W and transmitted through the substrate W.

Heat loads on the substrate W and on the substrate table WT can be compensated for by using feed-forward processing. The amount of IR radiation absorbed by the substrate W and by the substrate WT are parameters that can be input into the model used for the feed-forward processing. Other parameters can also be input into the model for the feed-forward processing in order to improve the accuracy of the compensation. These parameters can be calculated by performing measurements of the temperature change of the conditioning fluid in the conditioning system 81. The mass flow of the conditioning fluid through the channel 91 of the conditioning system 81 can be measured and/or controlled. The relevant thermal properties of the conditioning fluid (e.g. water) may either be known or can be measured. For example, the specific heat capacity of water is well-known. Accordingly, by measuring the temperature change of the conditioning fluid, the power absorbed by the substrate W and transmitted through the substrate W can be derived.

This power signal can be derived either during specific calibration tests or during lot production. Calibration tests can be performed when the lithographic apparatus 100 is off-line, i.e. when the lithographic apparatus 100 is not being used to exposed substrates W. Deriving the power signal during lot production maybe called in-line usage. The accuracy of the power signal can be increased by temporarily lowering the mass flow of the conditioning fluid through the channel 91 of the conditioning system 81. By lowering the mass flow, the temperature of the conditioning fluid is more sensitive to the power that is absorbed by the substrate W and transmitted through the substrate W. Moving average filters can be applied in order to increase the accuracy of the measurement of the power signal.

As mentioned above, parameters useful as input parameters for a feed-forward processing model can be derived from the temperature change measurement indicative of the temperature change of the conditioning fluid in the conditioning system 81. Accordingly, the temperature change measurement can be used to control the feed-forward processing during an exposure process. The temperature change measurement can be used to calculate a heat load at the substrate W that is exposed during an exposure process. The temperature change measurement can be used to control the exposure process so as to compensate for an exposure error associated with the heat load at the substrate W during the exposure process.

One parameter that is useful as an input parameter to improve the effectiveness of a feed-forward model is the dynamic gas lock heat load. This is explained below.

Figure 7:
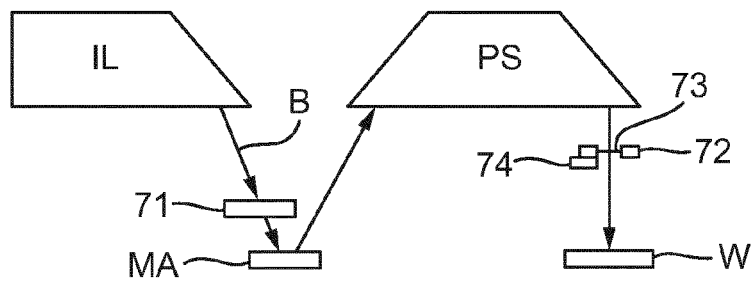
FIG. 7 depicts schematically part of a lithographic apparatus according to an embodiment of the present invention.

As depicted in FIG. 7, in an embodiment the lithographic apparatus 100 comprises an illumination system IL and a projection system PS. The illumination system IL is configured to emit a radiation beam B. The projection system PS is separated from the substrate table WT by an intervening space. The projection system PS is configured to project a pattern imparted to the radiation beam B onto the substrate W. The pattern is for EUV radiation of the radiation beam B.

The space intervening between the projection system PS an the substrate table WT can be at least partially evacuated. The intervening space may be delimited at the location of the projection system PS by a solid surface from which the employed radiation is directed toward the substrate table WT.

In an embodiment the lithographic apparatus 100 comprises a hollow part 72. The hollow part 72 is located in the intervening space. The hollow part 72 is situated around the path of the radiation. In an embodiment the lithographic apparatus 100 comprises a gas blower 74. The gas blower 74 is configured to flush the inside of the hollow part 72 with a flow of gas. This will be referred herein as a dynamic gas lock.

In an embodiment the hollow part 72 is cone-shaped. In an embodiment the hollow part 72 is covered by a membrane 73. The radiation travels through the membrane 73 before impinging on the substrate W.

The dynamic gas lock can cause a heat load on the substrate W. It is desirable to isolate the heat load caused by the dynamic gas lock from the heat loads caused by other factors (e.g. EUV radiation in the radiation beam, IR radiation in the radiation beam, etc).

In an embodiment the temperature change measurement is obtained when the illumination system IL is not emitting the radiation beam B. Accordingly, the temperature change measurement can be used to calculate the heat load at the substrate caused by the gas blower 74 (i.e. the gas blower 74 of the dynamic gas lock). When the illumination system IL is not emitting the radiation beam B, the heat load at the substrate W cannot be caused by EUV radiation or IR radiation of the radiation beam B. Accordingly, the measured heat load derived from the power signal that is in turn derived from the temperature change measurement can be attributed to the dynamic gas lock.

In an embodiment, a reference measurement is made when the dynamic gas lock is not present and the illumination system IL is not emitting any radiation beam B. The reference measurement can be used to filter out any noise of smaller heat loads caused by other factors. For example, the reference measurement (i.e. reference measurement of the temperature change of the conditioning fluid when the dynamic gas lock is not present) can be subtracted from the temperature change measurement made when the dynamic gas lock is present so as to determine the effect of the dynamic gas lock on the heat loads at the substrate W.

It is possible for the dynamic gas lock to have different heat effects in different regions. The temperature change measurement is indicative of the heat load caused by the dynamic gas lock integrated across the whole of the dynamic gas lock.

Another parameter that is useful as an input parameter for the feed-forward model is the heat load caused by IR radiation of the radiation beam B. As depicted in FIG. 7, in an embodiment the lithographic apparatus 100 comprises a patterning device MA. The patterning device MA is configured to impart a pattern to the irradiation beam B. The pattern is for EUV radiation of the radiation beam B.

Different patterning devices MA can be used in the lithographic apparatus 100. For example, a product patterning device can be used during an exposure process in order to project a specific pattern onto the substrate W. Tool patterning devices can be used during calibration processes. For example, one tool patterning device is configured to prevent substantially all EUV radiation of the radiation beam B from reaching the projection system PS (and hence from reaching the substrate W). The pattern imparted by such a tool patterning device is blank.

The patterning device MA comprises a reflecting multi-layer part and an absorber part. The reflecting multilayer part is configured to reflect EUV radiation. The absorber part is configured to absorb EUV radiation, thereby forming the EUV pattern. The patterning device MA affects IR radiation substantially uniformly. Therefore, the patterning device MA does not produce any pattern in the IR radiation. The patterning device MA configured to prevent substantially all EUV radiation from reaching the projection system PS (and hence from reaching the substrate W) has substantially no effect on the IR radiation in the radiation beam B. Substantially all of the IR radiation is reflected by the patterning device MA and is projected by the projection system PS onto the substrate W. Accordingly, the heat load at the substrate W is a combination of the heat load from the dynamic gas lock and the heat load from the IR radiation (plus background noise). If the heat load due to the dynamic gas lock is known, the heat load due to the IR radiation can be calculated as an isolated parameter.

The temperature change measurement indicative of the temperature change of the conditioning fluid can be obtained when such a patterning device MA is used in the lithographic apparatus 100. Accordingly, the temperature change measurement can be used to calculate the heat load at the substrate W caused by IR radiation of the radiation beam B. Accordingly, the IR heat load can be input as a parameter into the feed-forward model.

In an embodiment, the step of obtaining the dose measurement (which is indicative of a dose of IR radiation that reaches substrate level) is performed by obtaining a temperature change measurement indicative of a temperature change of the conditioning fluid. In an embodiment, temperature change measurements are obtained when a patterning device MA configured to prevent substantially all EUV radiation from reaching the projection system PS is used. A tool substrate has a known reflectivity (i.e. reflectance) for IR radiation. By comparing a temperature change measurement when the tool substrate is loaded to another temperature change measurement when a substrate W (of unknown reflectivity for IR radiation), the reflectivity of the substrate W can be determined.

Each temperature change measurement is indicative of the amount of radiation that is either absorbed by the substrate W or transmitted through the substrate W. When the reflectivity of the substrate W is known, the total amount of radiation (e.g. IR radiation in this case) that reaches substrate level can be calculated from the temperature change measurement.

As depicted in FIG. 7, in an embodiment the lithographic apparatus 100 comprises a masking device 71. The masking device 71 is configured to define an illumination area on the patterning device MA that is illuminated by the radiation beam B. In an embodiment the masking device 71 comprises so-called blades that block a portion of the radiation bean B. In an embodiment the masking device 71 comprises a plurality of blades, for example 4, these positions are controllable, e.g. by actuators such as stepper notice, so that the cross-section of the radiation beam B may be defined. It should be noted that the masking device 71 need not be positioned proximate the patterning device MA but in general will be located in a plane that is imaged onto the patterning device MA (a conjugate plane of the patterning device MA). The open area of the masking device 71 defines the area on the patterning device MA that is illuminated but may not be exactly the same as that area, e.g. if the intervening optics have a magnification different than 1.

The masking device 71 is controllable between an open position and a closed position. In the closed position, the masking device 71 is configured to prevent substantially all of the radiation beam B from reaching the patterning device MA. In the open position, substantially all of the patterning device MA is illuminated by the radiation beam B.

In an embodiment the temperature change measurement is obtained when the masking device 71 is configured to prevent substantially all of the radiation beam B from reaching the patterning device MA. Accordingly, the temperature change of the conditioning fluid is not caused by EUV radiation because substantially no EUV radiation reaches substrate level. The temperature change in the conditioning fluid is attributable to the heat load of the dynamic gas lock and the heat load of the portion of IR radiation that is reflected off the masking device 71. For example, approximately 50% of the IR radiation of the radiation beam B may be expected to be reflected off the masking device 71 when the masking device 71 is in the closed position. When the masking device 71 is in the closed position, the masking device 71 prevents substantially all of the EUV radiation from reaching the substrate level, and blocks about 50% of the IR radiation from reaching the substrate level.

If the heat load from the dynamic gas lock is known (e.g. previously measured), then the effect of the IR radiation reflected from the masking device 71 on the temperature change of the conditioning fluid can be isolated. Accordingly, the IR radiation reflectance from the masking device 71 can be calculated. This is a parameter that can be input into the feed-forward model in order to improve control of the exposure process so as to compensate for heat loads in the lithographic apparatus 100.

In an embodiment the lithographic apparatus 100 comprises an EUV energy sensor. In an embodiment the EUV energy sensor is a spot sensor or a slit sensor, for example. It is difficult to provide an EUV energy sensor that is sufficiently accurate. In particular, it is difficult to provide an EUV energy sensor that is sufficiently accurate in an absolute sense (i.e. such that a measured value of 4.2 Joules heats up 1 gram of water by 1° C.).

In an embodiment the temperature change measurement can be used to provide a measure of a dose of EUV radiation. In an embodiment, two temperature change measurements are obtained corresponding to two different patterning devices MA that reflect different proportions of EUV radiation. For example, in an embodiment a first temperature change measurement is obtained when the lithographic apparatus 100 comprises a first reference patterning device MA configured to allow a first reference percentage (e.g. about 0%) of EUV radiation of the radiation beam B to reach the substrate W. A second temperature change measurement can be obtained when the lithographic apparatus 100 comprises a second reference patterning device MA configured to allow a second reference percentage e.g. about 100%) of the EUV radiation of the radiation beam B to reach the substrate W. The difference between the first temperature change measurement and the second temperature change measurement is indicative of the effect of EUV radiation heating up (directly or indirectly) the conditioning fluid in the conditioning system 81. Accordingly, it is possible to calculate the dose of EUV radiation that is allowed to reach the substrate W.

It is not necessary for the first reference percentage to be 0% and the second reference percentage to be 100%. If other percentages are used (e.g. 2% and 70%), then the dose of EUV radiation per percentage of EUV radiation can be calculated. The dose of EUV radiation can be scaled or downed depending on what percentage of EUV radiation the patterning device MA allows through during an exposure process.

By using the temperature change measurement as a measure of the EUV radiation dose, it is possible to measure the EUV energy more accurately in an absolute sense. For example, a value of 4.2 Joules measure in this way does heat up 1 gram of water by 1° C.

In an embodiment the EUV energy dose is additionally measured by an EUV energy sensor such as a spot sensor or a slit sensor. By comparing the value measured by the EUV energy sensor with the value measured through the temperature change measurements, it is possible to calibrate the EUV energy sensor so that the EUV energy sensor can measure the EUV energy dose more accurately.

It can be difficult to determine what percentage of EUV radiation is reflected by the patterning device MA. In an embodiment the temperature change measurements can be used to measure the percentage EUV reflecting area of the patterning device MA.

As mentioned above, in an embodiment a first temperature change measurement is obtained when the lithographic apparatus 100 comprises a patterning device MA that has an EUV reflecting area of about 0%. A second temperature change measurement can be obtained when the lithographic apparatus 100 comprises another patterning device MA that has an EUV reflecting area of about 100%. The difference between the two temperature change measurements is attributable to the EUV radiation reflected by the patterning device MA.

By obtaining a further temperature change measurement when the lithographic apparatus 100 comprises a patterning device MA that has an unknown percentage EUV reflecting area, it is possible to determine the percentage EUV reflecting area by extrapolating from the previous temperature change measurements made with EUV reflecting areas of 0% and 100%, respectively. The percentage difference of EUV reflecting area is expected to be linearly proportional to the difference in the temperate change measurements. Accordingly, it is possible to calculate the parameter of the openness of the patterning device MA from the temperature change measurements.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the IR sensor 42 may be positioned distal from the substrate table WT.

An embodiment of the invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims and clauses set out below.

1. A method for compensating for an exposure error in an exposure process of a lithographic apparatus that comprises a substrate table, the method comprising:
    obtaining a dose measurement indicative of a dose of IR radiation that reaches substrate level, wherein the dose measurement can be used to calculate an amount of IR radiation absorbed by an object in the lithographic apparatus during an exposure process; and
    using the dose measurement to control the exposure process so as to compensate for an exposure error associated with the IR radiation absorbed by the object during the exposure process.
2. The method of clause 1, wherein the object is a substrate that is exposed during the exposure process.
3. The method of clause 1, wherein the object is the substrate table.
4. The method of clause 1, wherein the object is a mirror of a projection system that projects onto a substrate a patterned beam of radiation for the exposure process.
5. The method of clause 4, wherein the step of controlling the exposure process comprises controlling a heater based on the dose measurement, wherein the heater is configured to heat the mirror.
6. The method of any preceding clause, wherein the step of obtaining the dose measurement is performed by an IR sensor positioned at a peripheral part of the substrate table.
7. The method of any preceding clause, wherein the dose measurement is indicative of a dose of IR radiation having a wavelength in the range of from about 1 µm to about 10.6 µm.
8. The method of any preceding clause, comprising obtaining an absorptivity measurement indicative of an absorptivity of the object for the IR radiation.
9. The method of any clause 8, wherein the step of obtaining the absorptivity measurement comprises obtaining a measurement indicative of IR radiation reflected by the object.
10. The method of any of clauses 8 to 9, wherein the step of obtaining the absorptivity measurement is performed by a measurement apparatus other than the lithographic apparatus that performs the exposure process.
11. The method of any preceding clause, comprising calculating an effect of the IR radiation absorbed by the object on one or more of a deformation of the object, an overlay error of the exposure process, a temperature of the object and a focus error.
12. The method of any preceding clause, wherein:
    the lithographic apparatus comprises a conditioning system configured to control the temperature of the substrate table by means of a conditioning fluid; and
    the step of obtaining the dose measurement is performed by obtaining a temperature change measurement indicative of a temperature change of the conditioning fluid.
13. A method for compensating for an exposure error in an exposure process of a lithographic apparatus that comprises a substrate table and a conditioning system configured to control the temperature of the substrate table by means of a conditioning fluid, the method comprising:
    obtaining a temperature change measurement indicative of a temperature change of the conditioning fluid, wherein the temperature change measurement can be used to calculate a heat load at a substrate that is exposed during an exposure process; and
    using the temperature change measurement to control the exposure process so as to compensate for an exposure error associated with the heat load at the substrate during the exposure process.
14. The method of clause 13, wherein the lithographic apparatus comprises:
    an illumination system configured to emit a radiation beam;
    a projection system separated from the substrate table by an intervening space, wherein the projection system is configured to project a pattern imparted to the radiation beam onto the substrate, wherein the pattern is for EUV radiation of the radiation beam;
    a hollow part located in the intervening space and situated around the path of the radiation; and
    a gas blower for flushing the inside of the hollow part with a flow of gas;
    wherein the temperature change measurement is obtained when the illumination system is not emitting the radiation beam, such that the temperature change measurement can be used to calculate the heat load at the substrate caused by the gas blower.
15. The method of any of clauses 13 to 14, wherein the lithographic apparatus comprises:
    an illumination system configured to emit a radiation beam;
    a patterning device configured to impart a pattern to the radiation beam, wherein the pattern is for EUV radiation of the radiation beam; and
    a projection system configured to project the pattern imparted to the radiation beam by the patterning device onto the substrate;
    wherein the patterning device is configured to prevent substantially all EUV radiation of the radiation beam from reaching the projection system such that the pattern is blank and the temperature change measurement can be used to calculate the heat load at the substrate caused by IR radiation of the radiation beam.

16. The method of clause 15, comprising:
  obtaining a reference temperature measurement indicative of a temperature change of the conditioning fluid when the substrate table is supporting a tool substrate having a known reflectivity for IR radiation of the radiation beam;
  obtaining the temperature change measurement when the substrate table is supporting an exposure substrate having an unknown reflectivity for the IR radiation of the radiation beam;
  comparing the reference temperature measurement to the temperature change measurement so as to be able to calculate the reflectivity of the substrate for the IR radiation of the radiation beam; and
  using the reflectivity of the exposure substrate to control the exposure process so as to compensate for an exposure error associated with the heat load at the substrate during the exposure process.
17. The method of any of clauses 13 to 16, wherein the lithographic apparatus comprises:
  an illumination system configured to emit a radiation beam;
  a patterning device configured to impart a pattern to the radiation beam, wherein the pattern is for EUV radiation of the radiation beam; and
  a masking device configured to define an illumination area on the patterning device that is illuminated by the radiation beam;
  wherein the temperature change measurement is obtained when the masking device is configured to prevent substantially all of the radiation beam from reaching the patterning device, such that the temperature change measurement can be used to calculate the heat load at the substrate caused by IR radiation reflected by the masking device.
18. The method of any of clauses 13 to 17, wherein the lithographic apparatus comprises:
  an illumination system configured to emit a radiation beam;
  a patterning device configured to impart a pattern to the radiation beam, wherein the pattern is for EUV radiation of the radiation beam; and
  a projection system configured to project the pattern imparted to the radiation beam by the patterning device onto the substrate;
  wherein the patterning device is configured to allow a predetermined percentage of the EUV radiation of the radiation beam to reach the projection system, such that the temperature change measurement can be used to calculate the heat load at the substrate caused by EUV radiation of the radiation beam.
19. The method of any preceding clause, wherein the step of controlling the exposure process comprises controlling a position of the substrate table relative to a patterned beam of radiation for the exposure process based on the dose measurement.
20. The method of any preceding clause, wherein the exposure error comprises one or more of a deformation of the object, an overlay error of the exposure process, a temperature of the object and a focus error.
21. A device manufacturing method using a lithographic apparatus, wherein an exposure error associated with IR radiation absorbed by the object in the exposure process is compensated for using the method of any preceding clause.
22. A method for measuring reflectivity of an exposure substrate for a lithographic apparatus that comprises an illumination system configured to emit a radiation beam, a substrate table and a conditioning system configured to control the temperature of the substrate table by means of a conditioning fluid, the method comprising:
  obtaining a first temperature change measurement indicative of a temperature change of the conditioning fluid when the substrate table is supporting a tool substrate having a known reflectivity for IR radiation of the radiation beam;
  obtaining a second temperature change measurement indicative of a temperature change of the conditioning fluid when the substrate table is supporting an exposure substrate; and
  calculating the reflectivity of the exposure substrate for IR radiation of the radiation beam from the first temperature change measurement, the second temperature change measurement and the known reflectivity.
23. A method for measuring a dose of EUV radiation for a lithographic apparatus that comprises an illumination system configured to emit a radiation beam, a substrate table and a conditioning system configured to control the temperature of the substrate table by means of a conditioning fluid, the method comprising:
  obtaining a first temperature change measurement indicative of a temperature change of the conditioning fluid when the lithographic apparatus comprises a first reference patterning device configured to allow a first reference percentage of EUV radiation of the radiation beam to reach the substrate;
  obtaining a second temperature change measurement indicative of a temperature change of the conditioning fluid when the lithographic apparatus comprises a second reference patterning device configured to allow a second reference percentage of the EUV radiation of the radiation beam to reach the substrate; and
  calculating a dose of EUV radiation per percentage of EUV radiation of the radiation beam that is allowed to reach the substrate from the first temperature change measurement, the second temperature change measurement, the first reference percentage and the second reference percentage.

The invention claimed is:
1. A method comprising:
  obtaining a dose measurement indicative of a dose of IR radiation that reaches substrate level, wherein the dose measurement is used to calculate an amount of IR radiation absorbed by an object during a lithographic exposure process; and
  using the dose measurement to control the lithographic exposure process so as to compensate for an exposure error associated with the IR radiation absorbed by the object during the lithographic exposure process.
2. The method of claim 1, wherein the object is a mirror of a projection system that projects onto a substrate a patterned beam of radiation for the lithographic exposure process.
3. The method of claim 2, wherein
  controlling the lithographic exposure process comprises controlling a heater based on the dose measurement, and
  the heater is configured to heat the mirror.
4. The method of claim 1, wherein obtaining the dose measurement is performed by an IR sensor positioned at a peripheral part of a substrate table.
5. The method of claim 1, wherein the dose measurement is indicative of a dose of IR radiation having a wavelength in the range of from about 1 μm to about 10.6 μm.

6. The method of claim 1, further comprising obtaining an absorptivity measurement indicative of an absorptivity of the object for the IR radiation.

7. The method of claim 1, further comprising calculating an effect of the IR radiation absorbed by the object on one or more of a deformation of the object, an overlay error of the exposure process, a temperature of the object and a focus error.

8. The method of claim 1, further comprising:
using a conditioning fluid in a conditioning system of a lithographic apparatus to control a temperature of a substrate table in the lithographic apparatus; and
the obtaining the dose measurement is performed by obtaining a temperature change measurement indicative of a temperature change of the conditioning fluid.

9. The method of claim 1, wherein the step of controlling the exposure process comprises controlling a position of the substrate table relative to a patterned beam of radiation for the lithographic exposure process based on the dose measurement.

10. A method comprising:
obtaining a temperature change measurement indicative of a temperature change of a conditioning fluid,
calculating, based on the temperature change, a heat load at a substrate that is exposed during an exposure process; and
controlling the exposure process using the temperature change measurement so as to compensate for an exposure error associated with the heat load at the substrate during the exposure process.

11. The method of claim 10, wherein the lithographic apparatus comprises:
an illumination system configured to emit a radiation beam;
a projection system separated from the substrate table by an intervening space, wherein the projection system is configured to project a pattern imparted to the radiation beam onto the substrate, wherein the pattern is for EUV radiation of the radiation beam;
a hollow part located in the intervening space and situated around the path of the radiation; and
a gas blower for flushing the inside of the hollow part with a flow of gas;
wherein the temperature change measurement is obtained when the illumination system is not emitting the radiation beam, such that the temperature change measurement is used to calculate the heat load at the substrate caused by the gas blower.

12. The method of claim 10, wherein the lithographic apparatus comprises:
an illumination system configured to emit a radiation beam;
a patterning device configured to impart a pattern to the radiation beam, wherein the pattern is for EUV radiation of the radiation beam; and
a projection system configured to project the pattern imparted to the radiation beam by the patterning device onto the substrate; and
preventing, using the patterning device, substantially all EUV radiation of the radiation beam from reaching the projection system such that the pattern is blank and the temperature change measurement is used to calculate the heat load at the substrate caused by IR radiation of the radiation beam.

13. The method of claim 12 further comprising:
obtaining a reference temperature measurement indicative of a temperature change of the conditioning fluid when the substrate table is supporting a tool substrate having a known reflectivity for IR radiation of the radiation beam;
obtaining the temperature change measurement when the substrate table is supporting an exposure substrate having an unknown reflectivity for the IR radiation of the radiation beam;
comparing the reference temperature measurement to the temperature change measurement so as to be able to calculate the reflectivity of the substrate for the IR radiation of the radiation beam; and
using the reflectivity of the exposure substrate to control the exposure process so as to compensate for an exposure error associated with the heat load at the substrate during the exposure process.

14. The method of claim 10, wherein the lithographic apparatus comprises:
an illumination system configured to emit a radiation beam;
a patterning device configured to impart a pattern to the radiation beam, wherein the pattern is for EUV radiation of the radiation beam; and
a masking device configured to define an illumination area on the patterning device that is illuminated by the radiation beam; and
obtaining the temperature change measurement when the masking device is configured to prevent substantially all of the radiation beam from reaching the patterning device, such that the temperature change measurement is used to calculate the heat load at the substrate caused by IR radiation reflected by the masking device.

15. The method of claim 10, wherein the lithographic apparatus comprises:
an illumination system configured to emit a radiation beam;
a patterning device configured to impart a pattern to the radiation beam, wherein the pattern is for EUV radiation of the radiation beam; and
a projection system configured to project the pattern imparted to the radiation beam by the patterning device onto the substrate; and
reflecting, using the patterning device, a predetermined percentage of the EUV radiation of the radiation beam to reach the projection system, such that the temperature change measurement is used to calculate the heat load at the substrate caused by EUV radiation of the radiation beam.

16. A substrate table for a lithographic apparatus, wherein the substrate table is configured to support a substrate, the substrate table comprising:
an IR sensor positioned away from the location that supports the substrate and configured to obtain IR radiation directly, reflectively, or transmissively received from a source of IR radiation indicative of a dose of IR radiation that is incident on the substrate table.

17. A lithographic apparatus comprising;
an illumination system configured to emit a radiation beam;
a patterning device configured to impart a pattern to the radiation beam;
a projection system configured to project the pattern imparted to the radiation beam by the patterning device onto a substrate; and
a substrate table configured to support the substrate and comprising an IR sensor positioned away from the location that supports the substrate and configured to obtain IR radiation directly, reflectively, or transmissively received from a source of IR radiation indicative of a dose of IR radiation that is incident on the substrate table.

18. A system comprising:

a dose measurement module configured to obtain a dose measurement indicative of a dose of IR radiation that reaches substrate level; and a compensation module configured to calculate an amount of IR radiation absorbed by an object in a lithographic apparatus during an exposure process and to use the dose measurement to control the exposure process so as to compensate for an exposure error associated with the IR radiation absorbed by the object during the exposure process.

19. The system of claim 18, wherein the lithographic apparatus comprises:

an illumination system configured to emit a radiation beam;

a patterning device configured to impart a pattern to the radiation beam; and a projection system configured to project the pattern imparted to the radiation beam by the patterning device onto a substrate.

20. A system comprising:

a temperature change measurement module configured to obtain a temperature change measurement indicative of a temperature change of a conditioning fluid used to control temperature of a substrate; and a compensation module configured to calculate a heat load at the substrate that is exposed during an exposure process and to use the temperature change measurement to control the exposure process so as to compensate for an exposure error associated with the heat load at the substrate during the exposure process.

21. The system of claim 20, further comprising:

an illumination system configured to emit a radiation beam;

a patterning device configured to impart a pattern to the radiation beam; and a projection system configured to project the pattern imparted to the radiation beam by the patterning device onto the substrate.

* * * * *